Figure 3:
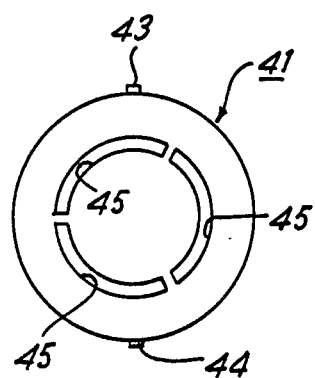

United States Patent [19]

Bennett

[11] Patent Number: 4,712,128

[45] Date of Patent: Dec. 8, 1987

[54] SEMICONDUCTOR DEVICES HAVING CONTACT ARRANGEMENT

[75] Inventor: Roger F. C. Bennett, Melksham, United Kingdom

[73] Assignee: Westinghouse Brake and Signal Co., Ltd., Chippenham, United Kingdom

[21] Appl. No.: 755,249

[22] Filed: Jul. 15, 1985

[30] Foreign Application Priority Data

Jul. 24, 1984 [GB] United Kingdom ............... 8418823

[51] Int. Cl.<sup>4</sup> .................. H01L 23/42; H01L 29/74; H01L 23/48
[52] U.S. Cl. ........................................ 357/79; 357/38; 357/68
[58] Field of Search ............................. 357/79, 38, 68

[56] References Cited

U.S. PATENT DOCUMENTS

| | | | |
|---|---|---|---|
| 3,975,758 | 8/1976 | Schlegel | 357/79 |
| 4,370,671 | 1/1983 | Eriksson et al. | 357/79 |
| 4,466,009 | 8/1984 | Konishi et al. | 357/38 |
| 4,542,398 | 9/1985 | Yatsuo et al. | 357/38 |
| 4,587,550 | 5/1986 | Matsuda | 357/79 |

Primary Examiner—Martin H. Edlow
Assistant Examiner—Robert P. Limanek
Attorney, Agent, or Firm—Nilsson, Robbins, Dalgarn, Berliner, Carson & Wurst

[57] ABSTRACT

A contact arrangement for a semiconductor device (typically a GTO thyristor), in which a disc-shaped first connector electrically connects one region of the semiconductor element with its associated contact. The first connector having therein apertures through which pass resiliently-loaded electrical connections to a second region of the element, the surface of that second region lying below the surface(s) of the first region. The various parts of the device may be so shaped as to ensure correct relative positioning of the parts during assembly and the maintenance of that positioning during subsequent handling.

17 Claims, 5 Drawing Figures

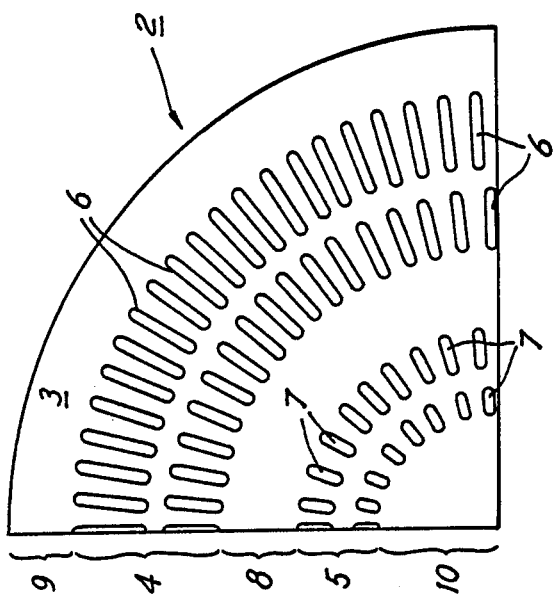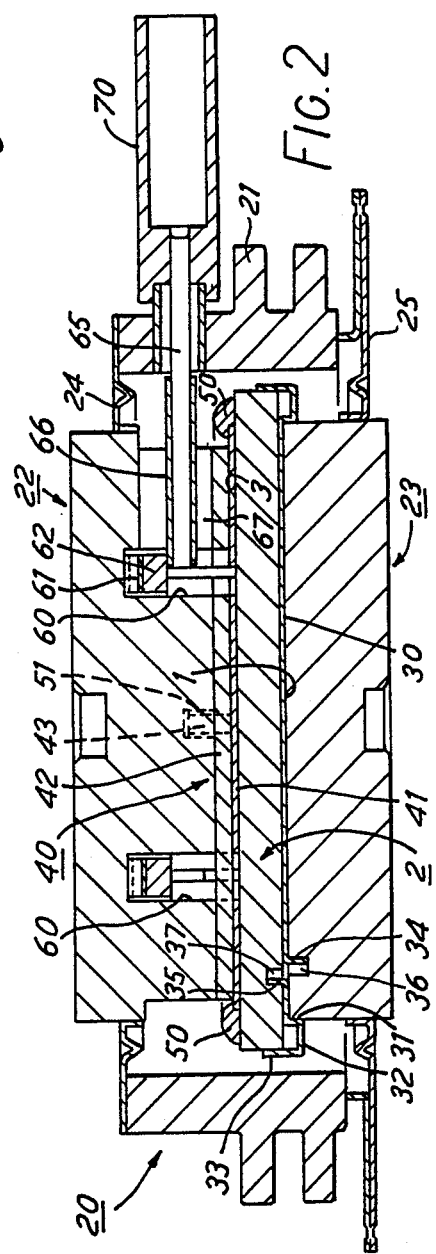

SEMICONDUCTOR DEVICES HAVING CONTACT ARRANGEMENT

This invention relates to semiconductor devices and, more particularly, to semiconductor devices of the kind having, on one of the opposed major faces of the semiconductor element of the device, concentric outer and inner annuli of a first region of conductivity and, positioned between them, an annulus of a second region of conductivity. Semiconductor devices of this kind will hereinafter be referred to as "of the type described". In such devices, the two annuli may each or either one of them may, be constituted by a series of, for example, annularly-arranged radially-projecting discrete regions which collectively form the or the respective one of the annuli.

Semiconductor devices of the type described (which are exemplified by certain forms of gate turn-off thyristors) pose the problem of effecting electrical connection from externally of the device to the respective regions; particularly connections which will obviate shorting of the two regions either during assembly of the device or during subsequent handling of the device.

To minimise this problem, the present invention provides a semiconductor device of the type described having a disc-shaped electrical connector which is sandwiched between the first region and a contact member constituting a part of the housing of the device, the electrical connector and the contact member both extending over that area of the major face of the semiconductor element which lies within the outer periphery of the outer of the annuli of the first region and both being rotationally and radially located with respect to the semiconductor element, the electrical connector having therethrough apertures aligned with the annulus of the second region through which project with their extremities engaged with the second region a plurality of electrically interconnected electrical connections, the electrical connections each being urged into engagement with the second region by resilient means located between the connections and the contact member whilst being electrically insulated therefrom, and an electrical contact extending externally of the housing of the device and electrically connected to the interconnected electrical connections.

The disc-shaped electrical connector may be in two parts one of which parts is of relatively thin electrically conductive material and the other of which parts is of electrically conductive material and is sufficiently thick as to resist deformation under the conventional spring-loading of the semiconductor device, the electrical connector being rotationally and radially located with respect to the semiconductor element by the first of the parts being secured to the semiconductor element by electrically insulating material and having tabs which serve to locate said other of the parts with respect thereto. In this case, said other of the parts may be radially located with respect to the contact member by a spigot which projects onto the contact member.

The device may be a so-called "hockey-puck" device, the contact member then constituting one of the conventional end contacts of the housing of the device. In this case, the contact member may additionally be rotationally and radially located with respect to the semiconductor element by the element being rotationally and radially located with respect to the other of the end contacts of the housing. Conveniently, there may be sandwiched between the other of the opposed major faces of the semiconductor element and said other of the contacts of the housing a shim of electrically conductive material, the element being radially located with respect to said other of the contacts by the shim having a first flange which engages the periphery of said other of the contacts, a second flange which engages the periphery of the semiconductor element, and the element being rotationally located with respect to said other of the contacts by the shim having tabs one of which serves to locate the shim relative to the semiconductor element and another of which serves to locate the shim relative to said other of the contacts.

The plurality of electrical connections may be comprised by the end portions of a tubular connector which is circumferentially divided adjacent its end comprising the plurality of electrical connections by slots extending axially part-way along the length of the tubular connector, the remainder of the tubular connector providing the electrical interconnection of the electrical connections. The resilient means may be a wave spring located between the contact member and the end of the tubular connector remote from the electrical connections. The end of the tubular member remote from the electrical connections may be insularly accommodated in an annular groove in the contact member.

The apertures in the electrical connector may be of such dimensions as compared to the cross-sectional area of the respective electrical connections where they pass through the apertures as to provide sufficient clearance between the sides of the apertures and the electrical connections as to effect electrical insulation therebetween.

Figure 4:
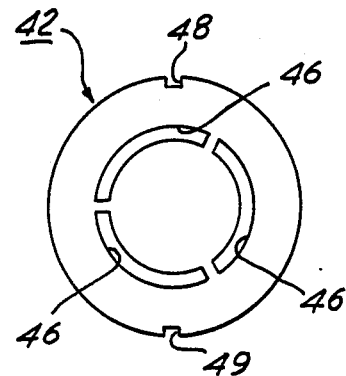
Figure 5:
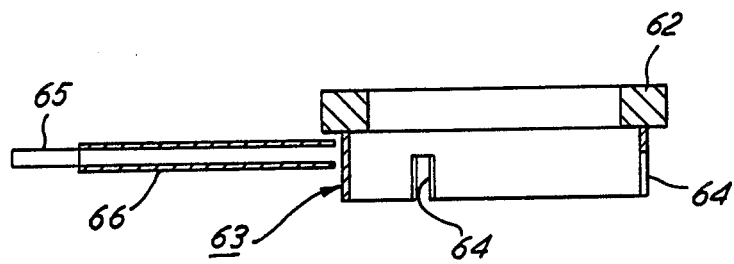

One embodiment of the present invention will now be described in greater detail, by way of example only, with reference to the accompanying drawings of which:

FIG. 1 shows a plan view of a quadrant of one face of a typical gate turn-off thyristor, FIG. 2 shows a cross-sectional view of the total semiconductor device, FIG. 3 shows a plan view of one part of the electrical connector, FIG. 4 shows a plan view of the other part of the electrical connector, and FIG. 5 shows a cross-sectional view of the electrical connections of the device.

Although the present invention is applicable equally to other semiconductor devices of the type described, it will hereinafter be illustrated by way of reference to one particular form of gate turn-off thyristor.

In this form of thyristor, referring firstly to FIG. 2, one major face 1 of the semiconductor element 2 has extending inwardly from that face 1 the anode region of the element 2. The opposite major face 3 has, as shown in detail in FIG. 1, concentric outer and inner annuli, 4 and 5 respectively, of a cathode region which is of one type of conductivity. Both annuli 4 and 5 are constituted by a series of radially-extending discrete fingers 6 and 7 respectively which collectively form the base region, the fingers 6 and 7 being arranged around the annuli 4 and 5.

Intermediate the annuli 4 and 5 is an annulus 8 which, together with the external annulus 9 and the central portion 10 to which it is electrically connected by the paths between the fingers 6 and 7, constitute the gate region of the semiconductor element 2.

The exposed surface of the fingers 6 and 7 all lie on a plane which lies slightly above the general plane of the remainder of the major face 3 of the element 2—i.e. the exposed surface of the gate region.

The semiconductor element 2 is mounted in a housing 20 of the so-called "hockey-puck" design. Such a housing 20, as is well known, comprises a ceramic tubular portion 21 which is hermetically closed at one end by a first cathode contact 22 and, similarly, at the other end by a second anode contact 23. The contacts 22 and 23 are so hermetically sealed to the ceramic tubular portion 21 by diaphragms 24 and 25 respectively.

Sandwiched between the element 2 and the anode contact 23 is a shim of silver 30 which has been shaped to provide a dependent first flange 31 which encircles the periphery of the anode contact 23 and thereby serves radially to locate the shim 30 with respect to the anode contact 23. Extending from the flange 31 is a radially-projecting mid-portion 32 from the outer extremity of which extends upwardly a second flange 33. This flange 33 encircles the periphery of the element 2 and thereby serves radially to locate the element 2 with respect to the shim 30. Thus, by the two flanges 31 and 33, the element 2 is radially located with respect to the anode contact 23. For rotational location of the element 2 relative to the anode contact 23, the shim 30 is formed with two tabs 34 and 35. The tab 34 projects downwardly into a bore 36 in the anode contact 23 and the tab 35 upwardly into a bore 37 in the major face 1 of the element 2.

By the flanges 31 and 33 and the tabs 34 and 35, the element 2 is positively located with respect to the anode contact against both rotational and radial movement. Such positive locaton restrains the element 2 from relative movement both during assembly of the semiconductor device and its handling after assembly.

Sandwiched between the cathode region constituted by the fingers 6 and 7 of the annuli 4 and 5, and the cathode contact 22 is a disc-shaped electrical connector 40. The connector is in two parts, a lower shim 41 formed of molybdenum and a backing plate 42 formed of molybdenum. The shim 41 (shown in more detail in FIG. 3) has upwardly projecting tabs 43 and 44 and three arcuate slots 45 and has, on its face to be adjacent the element 2, embossings of the same configuration as the fingers 6 and 7 of the annuli 4 and 5. The molybdenum backing plate 42 (shown in more detail in FIG. 4), also has three arcuate slots 46 and has a pair of diametrically-opposed peripheral motches 48 and 49.

Returning to FIG. 2, the shim 41 after having been accurately located on the element 2 with the embossings of the shim 41 aligned with the fingers 6 and 7, is secured thereto by a series of blobs 50 of silicon rubber which attach the shim 41 by its periphery to the major face 3 of the element 2. The backing plate 42 is located on the shim 41 with the shim's tabs 43 and 44 projecting into the notches 48 and 49 respectively of the backing plate 42 and into a pair of notches 51 (of which one only is seen in FIG. 2) in the peripheral face of the contact 22. In this position of the backing plate 42, the slots 46 therein are aligned with the slots 45 in the shim 41. Thus the two parts of the electrical connector 40 are located one with respect to the other and the aligned slots 45 and 46 provide apertures through the assembled connector 40. The backing plate 42 engages the inner face of the cathode contact 22 so that electrical connection is thereby provided from the contact 22 to the cathode region of the element 2.

The cathode contact 22 has therein a concentric groove 60. In this groove 60 lies a wave spring 61 one side of which bears against the end face of the groove 60 and the other against a ceramic ring 62.

As can be seen more clearly in FIG. 5, the ceramic ring 62 has secured to its planar face opposite the wave spring 61, a tubular member 63 which has axially extending from its free end a series of three slots 64 of which two only can be seen in FIG. 5. The portion of the tubular member 63 lying between the three slots 64 provide electrical connections which are electrically interconnected by that portion of the tubular member 63 lying adjacent the ceramic ring 62. Brazed to the tubular member 63 is a wire 65 covered along most of its length with PTFE tubing 66.

As can be seen in FIG. 2, the tubular member 63 is positioned in the groove 60 so that the PTFE-covered wire 65 lies in a radial slot 67 in the cathode contact 22, the wire 65 projecting through the ceramic tubular portion 21 to be brazed to a gate terminal 70 also hermetically sealed to the housing 20.

In this position of the tubular member 63, the portions thereof lying between the slots 64 project through the arcuate slots 45 and 46 of the electrical connector so that their free ends engage the element 2 in the annulus 8 of the gate region of the element 2. Such engagement is resiliently maintained by the wave spring 61 acting on the tubular member 63 through the ceramic ring 62. Thus, any variation of the level of the annulus 8 from the plane of the top surfaces of the fingers 6 and 7 is accommodated by the spring 61. With such assembly of the parts, the slots 64 in the tubular member 63 "bridge" the webs between the arcuate slots 45/46 in the electrical connector. The dimensions of the slots 45/46 are such as to give adequate clearance around the portions of the tubular member 63 projecting therethrough to accommodate any possible errors of misalignment and prevent any shorting of the gate and cathode regions through contact of the electrical connector 40 with the tubular member 63.

I claim:

1. A semi-conductor device comprising a semiconductor element positioned in a housing having on a first of two opposing major faces concentric outer and inner annuli of a first region of conductivity and positioned therebetween an annulus of a second region of conductivity, a disk shaped electrical connector sandwiched between that surface of the semiconductor element defining the first region of conductivity and a contact member that forms a part the housing of the device, the disk shaped electrical connector and the contact member both formed to extend out over an outer peripheral area of that surface of the semiconductor element radially outward of the concentric outer annuli of the first region of conductivity, both the disk shaped electrical connector and the contact member are supported to inhibit rotational and radial movement with respect to the semi-conductor element, the disk shaped electrical connector being formed with apertures therethrough which apertures are aligned with the annulus of the second region of conductivity, a plurality of electrically interconnected electrical connections supported in said housing adjacent the contact member to extend outward through the apertures of the disk-shaped electrical connectors, a resilient means which is located between each of the electrically interconnected electrical connections and the contact member for resiliently urging the electrically interconnected electrical connections through the apertures and into engagement with the annulus of the second region, a means for electrically insulating the resilient means from the contact member, and an electrical contact extending externally of the housing which is electrically connected to the electrically interconnected electrical connections, and wherein the plurality of the electrically interconnected electrical connections are formed from an electrically conductive tubular member which has a plurality of circumferentially separated slots formed to extend through said tubular member from an open end with the externally extending electrical contact being electrically connected to the tubular member.

2. A device has claimed in claim 1, wherein the disk-shaped electrical connector is formed by two parts one of which parts is of relatively thin electrically conductive material and the other of which parts is of electrically conducted material and is sufficiently thick as to resist deformation when the semi-conductor device is spring loaded, the disk-shaped electrical connector being supported to inhibit rotational and radial movement with respect to the semi-conductor element by securing the first part of the electrical connector to the semiconductor element by electrically insulating material and forming the first part with tabs which serve to engage the other of the parts to inhibit rotational and radial movement with respect thereto.

3. A device as claimed in claim 2 wherein:
said other of said parts is supported to inhibit rotational and radial movement with respect to the contact member by a spigot which projects onto the contact member.

4. A device as claimed in claims 2 or 3, wherein the device housing is formed by a tubular shaped structure opened at either end, with a cathode and anode member each closing one of said ends, and with the contact member constituting either the anode or the cathode member.

5. A device as claimed in claim 4, wherein the contact member is additionally mounted to inhibit rotational and radial movement with respect to the semi-conductor element by mounting the semi-conductor element to inhibit rotational and radial movement with respect to each of the contacts of the housing.

6. A device has claimed in claim 5, wherein sandwiched between the second of the opposing major faces of the semi-conductor element and said other of the anode or cathode member forming the end of the housing is a shim of the electrically conducted material, the semi-conductor element being mounted to inhibit radial movement with respect to said other of the anode or cathode member by the shim which has a first flange which engages a periphery of said other of the anode or cathode member, the shim further having a second flange which engages a periphery of the semi-conductor element, and wherein the semi-conductor element is mounted to inhibit rotational movement with respect to said other of the anode or cathode member by forming the shim to have tabs, one of which tabs serves to locate the shim relative to the semi-conductor element and another of which tabs serves to locate the shim relative to the other of the anode or cathode member to inhibit rotational or radial movement there between.

7. A device as claimed in claim 1 wherein the resilient means is a wave spring located between the contact member and an end of the tubular member remote from the open end.

8. A device is claimed in claim 7, where in the end of the tubular member remote from the open end is insularly accommodated in an annular groove in the contact member.

9. A device as claimed in claims 1 or 2 or 3 or 8 or 9 wherein the apertures in the electrical connector are of such dimensions as compared to the cross-sectional area of the respective electrical connections where they pass through the apertures as to provide sufficient clearance between the sides of the apertures and the electrical connector as to effect electrical insulation therebetween.

10. A device as claimed in claim 4 wherein the resilient means is a wave spring located between the contact member and an end of the tubular connector remote from the open end.

11. A device as claimed in claim 3 wherein the resilient means is a wave spring located between the contact member and an end of the tubular connector remote from the open end.

12. A device as claimed in claim 5 wherein the resilient means is a wave spring located between the contact member and an end of the tubular connector remote from the open end.

13. A device as claimed in claim 6 wherein the resilient means is a wave spring located between the contact member and an end of the tubular connector remote from the open end.

14. A device is claimed in claim 10 wherein the end of the tubular member remote from the open end is insularly accommodated in an annular groove in the contact member.

15. A device is claimed in claim 11 wherein the end of the tubular member remote from the open end is insularly accommodated in an annular groove in the contact member.

16. A device is claimed in claim 12 wherein the end of the tubular member remote from the open end is insularly accommodated in an annular groove in the contact member.

17. A device is claimed in claim 13 wherein the end of the tubular member remote from the open end is insularly accommodated in an annular groove in the contact member.

* * * * *